United States Patent [19]

Kawakita et al.

[11] Patent Number: 5,440,075
[45] Date of Patent: Aug. 8, 1995

[54] TWO-SIDED PRINTED CIRCUIT BOARD A MULTI-LAYERED PRINTED CIRCUIT BOARD

[75] Inventors: Kouji Kawakita, Joyo; Masahide Tsukamoto, Nara; Yasuhiko Horio, Osaka; Seiichi Nakatani, Hirakata; Akihito Hatakeyama, Kadoma, all of Japan

[73] Assignee: Matsushita Electric Industrial Co., Ltd., Osaka, Japan

[21] Appl. No.: 124,317

[22] Filed: Sep. 20, 1993

[30] Foreign Application Priority Data

Sep. 22, 1992 [JP] Japan ................ 4-252594

[51] Int. Cl.⁶ .............................. H05K 1/02
[52] U.S. Cl. ................... 174/265; 174/261; 174/262
[58] Field of Search .............. 174/265, 261, 262, 257, 174/258, 256

[56] References Cited

U.S. PATENT DOCUMENTS

| | | | |
|---|---|---|---|
| 3,077,511 | 2/1963 | Bohrer | 174/68.5 |
| 3,335,489 | 8/1967 | Grant | 29/628 |
| 3,922,777 | 12/1975 | Weitze et al. | 29/628 |
| 4,791,248 | 12/1988 | Oldenettel | 174/68.5 |
| 5,155,301 | 10/1992 | Mase | 174/88 R |
| 5,219,639 | 6/1993 | Sugawara et al. | 428/209 |
| 5,281,771 | 1/1994 | Swift et al. | 174/262 |

FOREIGN PATENT DOCUMENTS

| | | |
|---|---|---|
| 54-38562 | 3/1979 | Japan . |
| 59-158582 | 9/1984 | Japan . |
| 59-175191 | 10/1984 | Japan . |
| 60-136400 | 7/1985 | Japan . |
| 60-200595 | 10/1985 | Japan . |
| 61-8987 | 1/1986 | Japan . |
| 61-24298 | 2/1986 | Japan . |
| 63-47991 | 2/1988 | Japan . |

*Primary Examiner*—Leo P. Picard
*Assistant Examiner*—L. Thomas
*Attorney, Agent, or Firm*—Renner, Otto, Boisselle & Sklar

[57] ABSTRACT

A two-sided printed circuit board including a base having a first surface, a second surface substantially parallel to the first surface, and a plurality of through-holes formed in the base; a first conductive layer provided on the first surface of the base; a second conductive layer provided on the second surface of the base; and a conductive particle buried in each of the through-holes in a pressurized state for electrically connecting the first conductive layer and the second conductive layer.

16 Claims, 5 Drawing Sheets

TWO-SIDED PRINTED CIRCUIT BOARD A MULTI-LAYERED PRINTED CIRCUIT BOARD

BACKGROUND OF THE INVENTION

1. Field of the Invention

The present invention relates to a two-sided printed circuit board on which electronic devices are mounted, a multi-layered printed circuit board including such a two-sided printed circuit board, and a method for producing the same.

2. Description of the Related Art

Recently, electronic devices have been progressively enhanced in performance and reduced in size. In accordance with such developments, a circuit board having a larger number of conductive layers patterned to be circuits (hereinafter, referred to as the "circuit conductive layer") and having a larger number of electronic devices in an area unit has been demanded. An example of a conventional circuit board is a multi-layered printed circuit board including a base formed of a resin such as glass epoxy resin. In such a circuit board, a plurality of circuit conductive layers are electrically connected to each other vertically via plating on inner walls of through-holes formed in the circuit board. In this specification, such connection is referred to as the "conventional through-hole connection".

In order to realize a conventional through-hole connection, through-holes should be formed to run from a top surface to a bottom surface of the printed circuit board. In a multi-layered printed circuit board including a plurality of printed circuit boards with such through-holes, it is impossible to realize connection between arbitrary conductive layers, namely "inner via hole connections". Accordingly, a plurality of electronic devices such as ICs provided on the printed circuit boards cannot be connected by a shortest possible distance. In such a structure, electronic devices cannot be arranged with a high density.

Further, with such conventional through-hole connections, a complicated circuit having a great number of note or a large scale cannot be reduced in size due to a great number of through-holes required.

By contrast, in a multi-layered printed circuit board including a ceramic substrate, an inner via hole connection is realized. However, a ceramic base is expensive, and further production of a large size ceramic substrate is difficult. For these reasons, ceramic bases are not widely used in practical application.

SUMMARY OF THE INVENTION

A two-sided printed circuit board according to the present invention includes a base having a first surface, and a second surface substantially parallel to the first surface, the base having a plurality of through-holes; a first conductive layer provided on the first surface of the base; a second conductive layer provided on the second surface of the base; and a conductive particle buried in each of the through-holes in a pressurized state for electrically connecting the first conductive layer and the second conductive layer.

A multi-layered printed circuit board according to the present invention includes two bases provided in a laminated state; and a conductive layer provided between the two bases. The bases each include a plurality of through-holes. The through-holes each have a conductive particle buried therein in a pressurized state. The conductive particle electrically connects the conductive layer and another conductive layer provided on at least one of the two bases.

A method for producing a two-sided printed circuit board includes the steps of forming a plurality of through-holes in a base; inserting a conductive particle into each of the through-holes; and heating and pressurizing the base and the conductive particles while holding the base between two conductive layers, thereby electrically connecting the conductive particles and the two conductive layers.

A method for producing a multi-layered printed circuit board includes the steps of forming a plurality of through-holes in each of a plurality of bases; inserting a conductive particle into each of the through-holes in the plurality of the bases; heating and pressurizing a first conductive layer, a second conductive layer, and a first base of the plurality of the bases therebetween, thereby electrically connecting the conductive particles and the first and the second conductive layers, and then patterning the first and the second conductive layers, thereby forming a two-sided printed circuit board; and placing a third conductive layer on a second base of the plurality of the bases and laminating the second base on the two-sided printed circuit board, and then pressurizing the second base with the third conductive layer and the two-sided printed circuit board, thereby electrically interconnecting the first, the second and the third conductive layers through the conductive particles.

A method for producing a multi-layered printed circuit board includes the steps of forming a plurality of through-holes in each of a plurality of bases; inserting a conductive particle into each of the through-holes of the plurality of the bases; heating and pressurizing a first conductive layer, a second conductive layer, and a first base of the plurality of the bases held therebetween, thereby electrically connecting the conductive particles and the first and the second conductive layers, and then patterning the first and the second conductive layers, thereby forming a first two-sided printed circuit board; heating and pressurizing a third conductive layer, a fourth conductive layer, and a second base of the plurality of bases held therebetween, thereby electrically connecting the conductive particles and the third and the fourth conductive layers, and then patterning the third and the fourth conductive layers, thereby forming a second two-sided printed circuit board; and providing a third base of the plurality of the bases between the first printed circuit board and the second printed circuit board, and then pressurizing the third base and the first and the second printed circuit boards, thereby electrically connecting one of the first and the second conductive layers of the first two-sided printed circuit board and one of the third and the fourth conductive layers of the second two-sided printed circuit board via the conductive particles buried in the through-holes of the third conductive layer.

In one embodiment of the invention, the base is formed of a composite material containing an aromatic polyamide fiber and a thermosetting resin.

In one embodiment of the invention, the base is formed of an alamid epoxy resin sheet.

In one embodiment of the invention, the conductive particle is formed of a metal.

In one embodiment of the invention, the conductive particles are formed of a material selected from the group consisting of gold, silver, copper, nickel, palladium, lead and tin.

In one embodiment of the invention, the conductive particles each include a core and a conductive layer enclosing the core.

In one embodiment of the invention, the core is formed of a particle formed of a metal, and the conductive layer is formed of another metal adhering to the core.

In one embodiment of the invention, the core is formed of a particle formed of a resin, and the conductive layer is formed of a metal adhering to the core.

In one embodiment of the invention, a size of each of the conductive particles before being heated and pressurized in a thickness direction of the printed circuit board is larger than a thickness of the base after being heated and pressurized.

In one embodiment of the invention, by heating and pressuring, the base is compressed to have a thickness of 40% to 70% of the thickness thereof before being heated and pressurized.

In one embodiment of the invention, by heating and pressuring, the conductive particles are each compressed to have a size in the direction of the base of 30% to 70% of the size thereof before being heated and pressurized.

In one embodiment of the invention, by heating and pressuring, the base is compressed to have a thickness of 40% to 70% of the thickness thereof before being heated and pressurized, and the conductive particles are each compressed to have a size in a thickness direction of the base of 30% to 70% of a size thereof before being heated and pressurized.

In a two-sided or a multi-layered printed circuit board according to the present invention, conductive layers are electrically connected to each other by conductive particles which are pressurized and thus adhering to each of the conductive layers. In such a structure, an inner via hole connection between the conductive layers is realized via the conductive particles. Accordingly, a complicated circuit can be mounted on a single circuit board using a base formed of a resin, which is inexpensive.

In a method for producing a two-sided or multiple printed circuit board according to the present invention, conductive layers are electrically connected via through-holes in the bases without using plating on inner walls of the through-holes. Further, the number of conductive layers can be increased only by repeating the step of heating and pressurizing.

Thus, the invention described herein makes possible the advantages of providing (1) a two-sided printed circuit board including a base formed of a resin in which electrical connection between electrodes is easily performed by an inner via hole connection; (2) a multi-layered printed circuit board including such a two-sided printed circuit board, (3) a method for producing such a two-sided printed circuit board, and (4) a method for producing such a multi-layered printed circuit board.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating examples with reference to the accompanying drawings.

Figure 1:
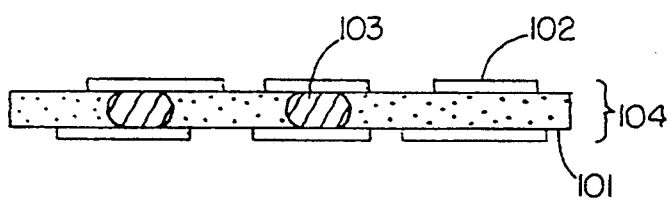
FIG. 1 is a cross sectional view of a two-sided printed circuit board according to the present invention.

FIG. 1 shows a cross sectional view of a two-sided printed circuit board in an example according to the present invention. The two-sided printed circuit board 104 includes a base 101 having a top surface and a bottom surface. The base 101 has a plurality of through-holes running from the top surface to the bottom surface. Each through-hole includes a conductive particle 103 buried therein. Copper foils 102 provided in a pattern are provided both on the top surface and bottom surface of the base 101. Each conductive particle 103 in the through-hole electrically connects the copper foil 102 on the top surface and the copper foil 102 on the bottom surface. In each through-hole, the conductive particle 103 is in a pressurized state and in contact with the copper foils 102 on the top and the bottom surfaces of the base 101. As a result of heating and pressurizing described later, the conductive particles 103 have a thickness substantially identical with the thickness of the base 101.

The base 101 may be formed of known materials such as glass epoxy resin, alamid epoxy resin, and phenol cast on a paper carrier. Before heating and pressurizing, such a base, which is formed by impregnating a glass cloth or an unwoven fabric as a core material with an uncured resin, is referred to as a prepreg. The prepreg is compressed by heating and pressurizing to be a base having a smaller thickness than that before heating and pressurizing. In other words, the diameter of the conductive particle 103 is selected to be larger than the thickness of the base 101 obtained after heating and pressurizing (hereinafter, referred to as the "final thickness"). By selecting such a diameter, the copper foil 102 and the conductive particle 103 are reliably in contact with each other as a result of heating and pressurizing.

Figure 5:
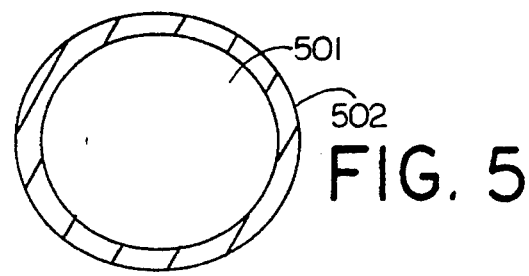
FIG. 5 is a view illustrating a structure of a conductive particle used in a printed circuit board according to the present invention.

The conductive particles 103 may be formed of gold, silver, copper, tin, lead, or almost any other metal. In addition to such pure metals, an alloy or an insulating core covered with a conductive material as shown in FIG. 5 can be used. In the example of FIG. 5, a spherical core 501 is covered with a conductive layer 502.

FIGS. 2A through 2D illustrate a method for producing the two-sided printed circuit board shown in FIG. 1.

First, through-holes are formed in a prepreg 201 using a drill. A laser beam may be used for a prepreg of a certain material.

Figure 2A:
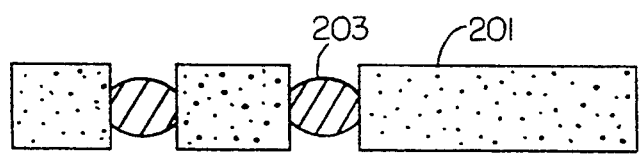
FIGS. 2A through 2D are views illustrating a method for producing a two-sided printed circuit board according to the present invention.
Figure 11:
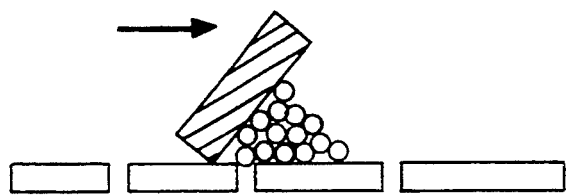
FIG. 11 is a view illustrating a method for inserting conductive particles into through-holes.

Next, as is shown in FIG. 2A, conductive particles 203 are inserted into the through-holes. In detail, a plurality of conductive particles 203 are provided on the prepreg 201, and then inserted using, for example, a tool as shown in FIG. 11. Alternatively, the conductive particles 203 are inserted one by one using tweezers. The diameter of the conductive particle 203 is selected to be larger than the final thickness of the base 101 in order to prevent a defective inner via hole connection. The diameter of each through-hole is preferably slightly smaller than the diameter of the conductive particle 203, in order to prevent the conductive particles 203 from dropping.

Figure 12A:
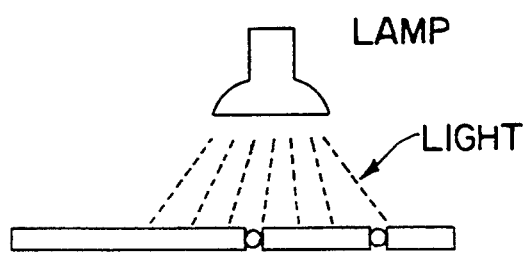
FIGS. 12A and 12B are views illustrating a method for inspecting if each of a plurality of through-holes includes a conductive particle.
Figure 12B:
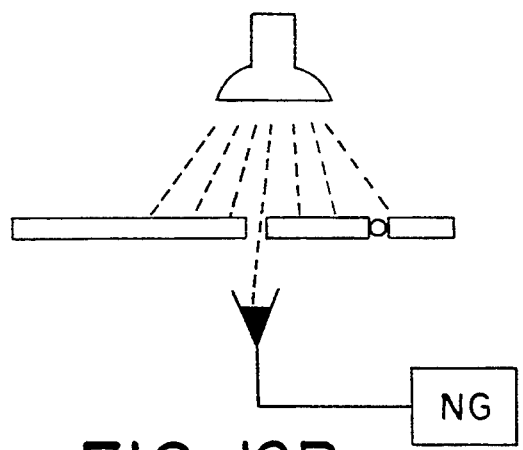

Preferably, inspection is performed to check if the conductive particles 203 are inserted into all the through-holes, in order to prevent a defective inner via hole connection. The inspection may be performed visually, but is preferably done by a method shown in FIGS. 12A and 12B. In this method, a light emitting device such as a lamp for radiating light to the prepreg 201 and a photodetecting device for detecting the light transmitted through the through-holes of the prepreg 201 are used. The prepreg 201 is moved horizontally below the light emitting device. If the photodetecting device detects light, the through-hole which has transmitted light does not include a conductive particle 203 as is shown in FIG. 12B. Then, conductive particles 203 are inserted into such through-holes.

Before the conductive particles 203 are inserted into the through-holes, a top surface of the prepreg 201 is preferably covered with a PET film or the like (not shown). After the conductive particles 203 are inserted into the through-holes, the conductive particles 203 remaining on the top surface of the prepreg 201 can be removed reliably and easily by peeling off the PET film from the prepreg 201. Such a film may be formed of any material which can be peeled off from the prepreg 201.

Figure 2B:
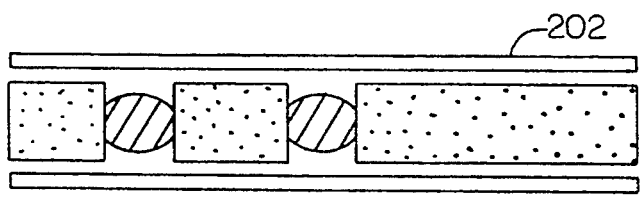
Figure 2C:
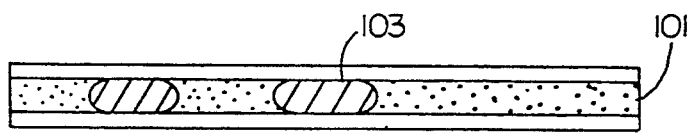

As is shown in FIG. 2B, two copper foils 202 are provided on the top surface and a bottom surface of the prepreg 201, respectively. Then, as is shown in FIG. 2C, the resultant lamination is heated while being pressurized from two surfaces thereof. By such a heating and pressurizing step, the prepreg 201 is reduced in thickness and the resin forming the prepreg 201 is cured. Thus, the prepreg 201 is turned to be the base 101. The conductive particles 203 are pressurized to be deformed as the conductive particles 103. Each conductive particle 103 in a pressurized state is in contact with the copper foils 202 on both of the surfaces of the base 101, thereby electrically connecting the copper foils 202.

Figure 2D:
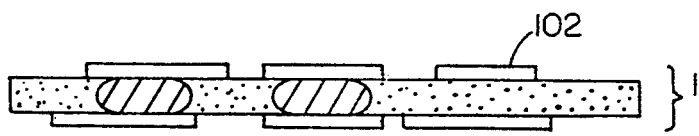

As is shown in FIG. 2D, the copper foils 202 are patterned in accordance with a desired wiring pattern. The patterning is performed by etching selected areas of the copper foils 202 by photolithography.

The patterned copper foils 102 are used as circuit conductive layers. On the printed circuit board produced in this manner, a resist is formed or letters and symbols are printed, or holes for inserting devices are formed thereafter.

In FIG. 2A, the diameter of the conductive particles 203 is smaller than the thickness of the prepreg 201, but the conductive particles 203 may have a size larger than the thickness of the prepreg 201.

Figure 3A:
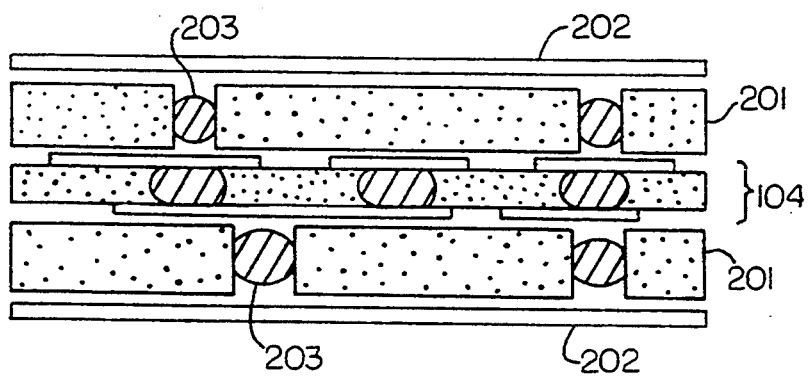
FIGS. 3A and 3B are views illustrating a method for producing a multi-layered printed circuit board according to the present invention.
Figure 3B:
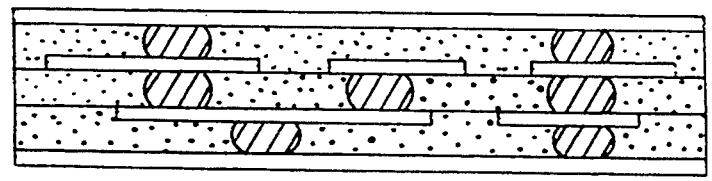

FIGS. 3A and 3B illustrate a method for producing a multi-layered printed circuit board in an example according to the present invention. In this example, the two-sided printed circuit board 104 produced in the method in FIGS. 2A through 2D is used as a core substrate. In addition to the two-sided printed circuit board 104, two prepregs 201 including conductive particles 203 as shown in FIG. 2A are used.

As is shown in FIG. 3A, the prepregs 201 including the conductive particles 203 are provided on a top surface and a bottom surface of the core substrate 104. A copper foil 202 is provided on an outer surface of each of the prepregs 201. Then, the resultant lamination is heated while being pressurized from both of the outer surfaces. As is shown in FIG. 3B, inner via hole connection is realized in the resultant lamination.

The copper foils 202 on both of the outer surfaces are patterned, thereby producing a multi-layered printed circuit board including four circuit conductive layers.

By repeating this procedure, a multi-layered printed circuit board including a larger number of circuit conductive layers can be produced.

In the method illustrated in FIGS. 3A and 3B, the two-sided printed circuit board according to the present invention is used as a core substrate, but a conventional printed circuit board having conventional through-hole connections may be used. In the case where such a conventional board is used, the through-holes should be filled with an appropriate material in advance. Needless to say, the core substrate may be formed of a ceramic material or the like.

Figure 4A:
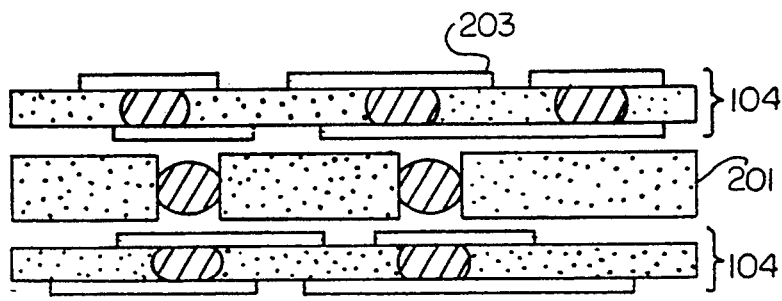
FIGS. 4A and 4B are views illustrating another method for producing a multi-layered printed circuit board according to the present invention.
Figure 4B:
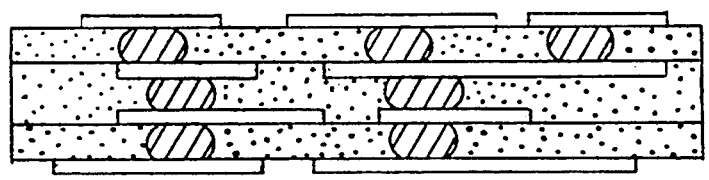

FIGS. 4A and 4B illustrate another method for producing a multi-layered printed circuit board.

In FIG. 4A, a prepreg 201 including conductive particles 203 is interposed between two two-sided printed circuit boards 104 produced in the method illustrated in FIGS. 2A through 2D. Such a lamination is heated while being pressurized, thereby producing a multi-layered printed circuit board including four circuit conductive layers as is shown in FIG. 4B.

By interposing a plurality of prepregs 201 between three or more two-sided printed circuit boards 104 and treating such a lamination by heating and pressurizing, a multi-layered printed circuit board including a larger number of circuit conductive layers can be produced.

In the method illustrated in FIGS. 4A and 4B, the two-sided printed circuit boards according to the present invention are used, but conventional printed circuit boards having conventional through-hole connections may be used. In the case where such a conventional boards are used, the through-holes should be filled with an appropriate material in advance. Needless to say, ceramic boards may be used alternatively.

Figure 13A:
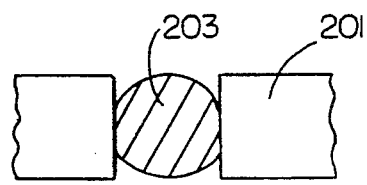
FIG. 13A is a view illustrating a base having one conductive particle buried in a through-hole thereof.
Figure 13B:
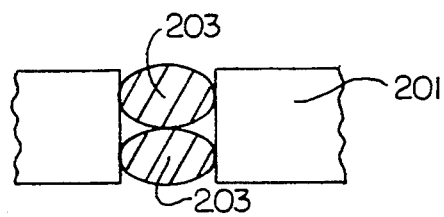
FIG. 13B is a view illustrating a base having two conductive particles buried in a through-hole thereof.

In the above examples, each of the through-holes includes one conductive particle buried therein. Each through-hole may have two or more conductive particles. FIG. 13A illustrates a base having one conductive particle buried in a through-hole thereof; and FIG. 13B illustrates a base having two conductive particles buried in a through-hole thereof. In such a case, conductive particles having a smaller diameter than the depth of the through-hole can be used. Accordingly, the through-holes can be reduced in diameter, and thus a high density device is more easily produced. However, in the case of a printed circuit board including two conductive particles in each of the through-holes, inspection of the existence of the conductive particles is more difficult than the case of one conductive particle. Further, two conductive particles buried vertically may undesirably offset from each other, and thus the possibility that defective connection occurs is quite high. For these reasons, providing one conductive particle in one through-hole is preferable.

Hereinafter, printed circuit boards in practical examples according to the printed circuit board according to the present invention will be described.

EXAMPLE 1

Two-sided printed circuit boards were produced in the following manner. A plurality of two-sided printed circuit boards were produced for comparison, but the description will be made for only one of them for simplicity.

As is shown in FIG. 2A, a prepreg 201 formed of an alamid epoxy resin sheet (TA-O1 produced by TEIJIN) having a thickness of 200 μm was used. Through-holes each having a diameter of 0.2 mm were formed in the prepreg 201.

The through-holes were filled with particles formed of gold, each having a diameter of 0.15 or 0.20 mm. A top surface and a bottom surface of the prepreg 201 were each coated with a copper foil 202. The resultant lamination was pressurized by a press having a temperature of 170° C., at a pressure of 10 to 100 kg/cm² for 60 minutes, thereby obtaining a base 101 (FIG. 1) including copper on both surfaces thereof. A plurality of pressure levels between 10 to 100 kg were used in order to compress the prepreg 201 to have different final thicknesses.

The copper foils 202 on both surfaces of the base 101 were etched by a known etching method, thereby forming an electrode pattern.

Figure 6:
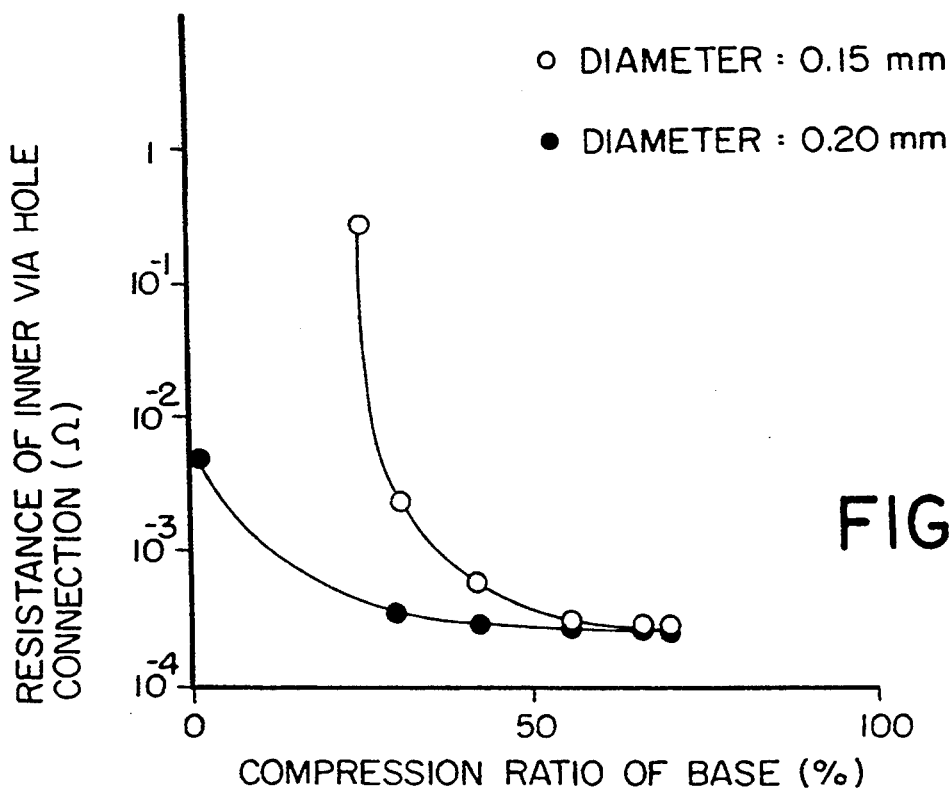
FIG. 6 is a graph illustrating the relationship between the resistance of an inner via hole connection and the compression ratio of the base, concerning printed circuit boards using gold particles according to the present invention.

FIG. 6 illustrates the relationship between the resistance of an inner via hole connection and the compression ratio of the base when the gold particles having a diameter of 0.15 mm were used and when the gold particles having a diameter of 0.20 mm were used. Herein, the compression ratio means the ratio of the thickness of the base or conductive particles reduced as a result of heating and pressurizing with respect to the thickness of the base or the size of the conductive particles in the thickness direction of the base after being heated and pressurized.

When the thickness of the base was reduced to be smaller than the size of the gold particles in the thickness direction of the base by compression, the copper foils on both of the surfaces and the gold particles contacted each other and thus were electrically connected to each other. In the case where the thickness of the base after compression was larger than the size of the gold particles, the copper foils and the gold particles were not electrically connected to each other, the size of the gold particles being measured in the thickness direction of the base.

Figure 7:
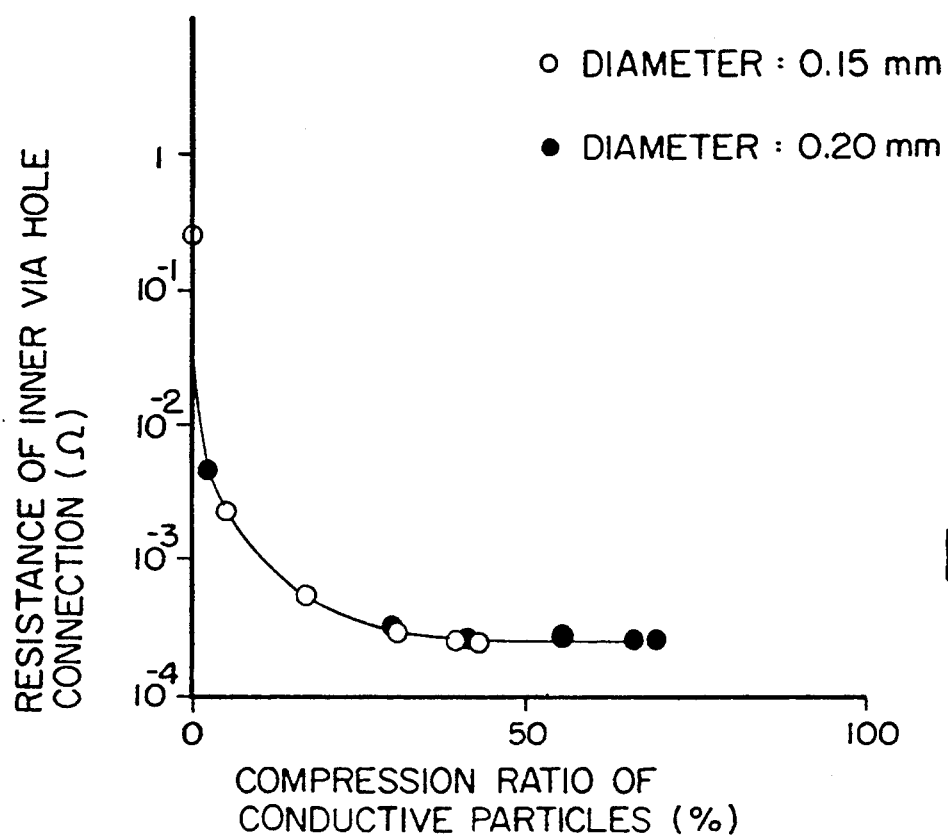
FIG. 7 is a graph illustrating the relationship between the resistance of an inner via hole connection and the compression ratio of the gold particles, concerning printed circuit boards using the gold particles according to the present invention.

FIG. 7 illustrates the relationship between the resistance of an inner via hole connection and the compression ratio of the gold particles when the gold particles having a diameter of 0.15 mm were used and when the gold particles having a diameter of 0.20 mm were used. The compression ratio of the gold particles were calculated based on the compression ratio of the base.

The resistance of the inner via hole connection is lowered in correspondence with an increase in the compression ratio. Especially in the region of a compression ratio of 30% or more, an inner via hole connection having a constant, low resistance was realized. When the compression ratio was more than 70%, the gold particles were expanded laterally and thus had inconveniences in practical use.

Figure 8:
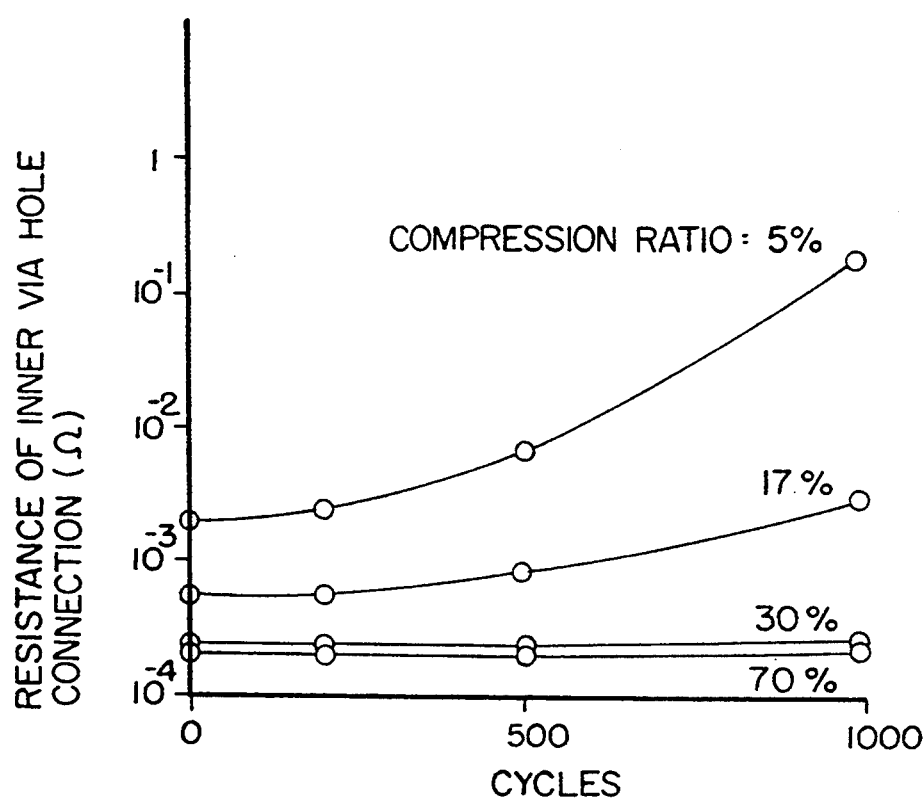
FIG. 8 is a graph illustrating a result of a heat cycle test conducted for two-sided printed circuit boards including gold particles according to the present invention.

FIG. 8 illustrates a change in the resistance of an inner via hole connection in a heat cycle test conducted for two-sided printed circuit boards according to the present invention. The heat cycle test, which was conducted to check the reliability, was performed at a temperature of −55° C. to 125° C. using two-sided printed circuit boards with different compression ratios of the gold particles.

Even after 1000 cycles, the inner via hole connection was stable with increase in the resistances being small. In the case where the compression ratio was 30% or more, substantially no increase was indicated in the resistance of the inner via hole connection.

EXAMPLE 2

In a similar manner as in Example 1, through-holes having a diameter of 0.20 mm were formed in a prepreg and filled with solder particles having a diameter of 0.15 mm or 0.20 mm. A top surface and a bottom surface of the prepreg were each coated with a copper foil, and the resultant lamination was pressurized by a press having a temperature of 170° C. at a pressure of 10 to 100 kg/cm² for 60 minutes.

The copper foils were etched by a known etching method, thereby producing an electrode pattern. Thus, a two-sided printed circuit board was produced.

Figure 9:
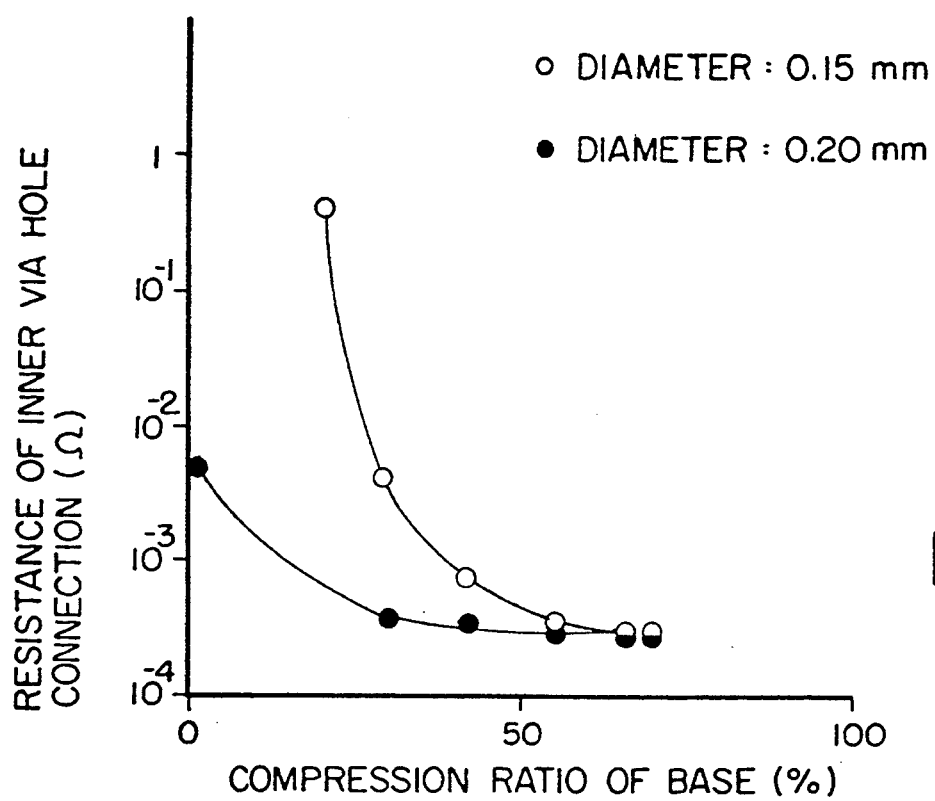
FIG. 9 is a graph illustrating the relationship between the resistance of an inner via hole connection and the compression ratio of the base, concerning printed circuit boards using solder particles according to the present invention.

FIG. 9 illustrates the relationship between the resistance of an inner via hole connection and the compression ratio of the base when the solder particles having a diameter of 0.15 mm were used and when the solder particles having a diameter of 0.20 mm were used.

The resistance was as low as in the case where gold particles were used.

In a heat cycle test, the resistance of the inner via hole did not greatly change even after 1000 cycles. Especially when the compression ratio of the solder particles was 30% or more, substantially no increase was indicated in the resistance of the inner via hole connection.

EXAMPLE 3

In a similar manner as in Examples 1 and 2, through-holes having a diameter of 0.20 mm were formed in a prepreg and filled with particles. The particles were formed of a copper or a polypropylene core having a diameter of 0.20 mm plated with a silver layer having a thickness of 5 μm. A top surface and a bottom surface of the prepreg was each coated with a copper foil, and the resultant lamination was pressurized by a press having a temperature of 170° C. at a pressure of 10 to 100 kg/cm$^2$ for 60 minutes.

The copper foils were etched by a known etching method, thereby producing an electrode pattern. Thus, a two-sided printed circuit board was produced.

Figure 10:
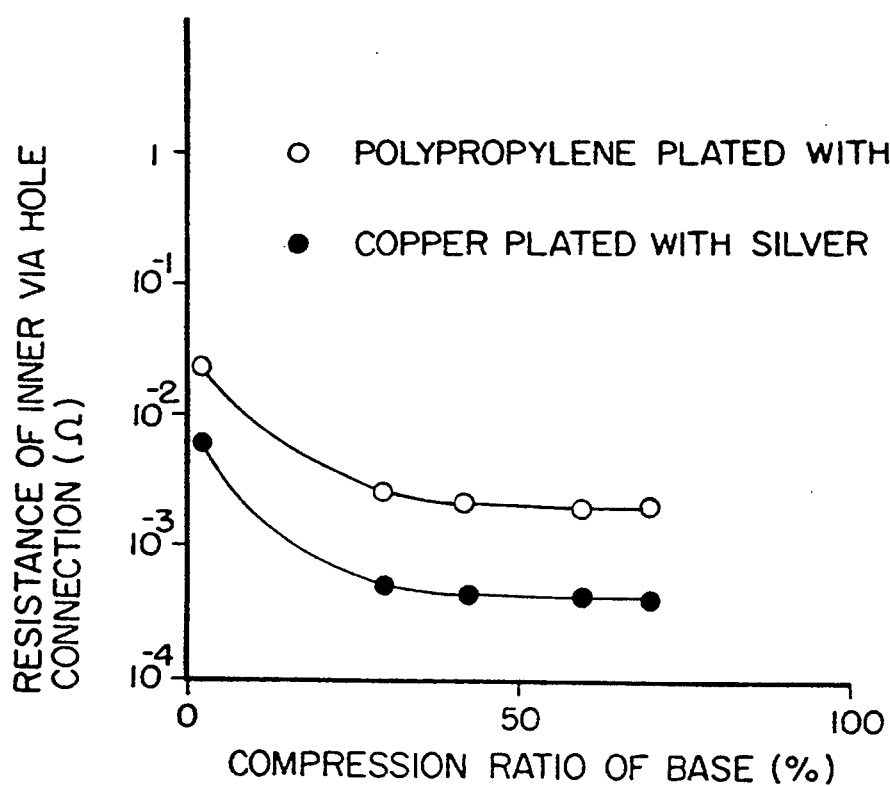
FIG. 10 illustrates the relationship between the resistance of an inner via hole connection and the compression ratio of the base, concerning printed circuit boards respectively including copper particles and particles formed of a polypropylene core plated with silver.

FIG. 10 illustrates the relationship between the resistance of an inner via hole connection and the compression ratio of the base when the particles formed of the copper core plated with silver were used and when the particles formed of the polypropylene core plated with silver were used.

The resistance was low with both types of particles. Especially, in the case where the copper core was used, the resistance was as low as in Example 1. In the case where the polypropylene core was used, the resistance was not as low as in Example 1 but still 0.1 Ω or less and thus had no problem in practical use.

In a heat cycle test, the resistance did not greatly change even after 1000 cycles. Especially when the compression ratio of the particles was 30% or more, substantially no increase was indicated in the resistance of the inner via hole connection.

EXAMPLE 4

A multi-layered printed circuit board including four conductive layers was produced in the following manner.

Two two-sided printed circuit boards produced in Example 1 were used. Such two-sided printed circuit boards each have an electrode pattern for measuring a resistance of an inner via hole connection. A prepreg formed of alamid epoxy resin was interposed between the two two-sided printed circuit boards. The prepreg includes gold particles having a diameter of 0.20 mm at a position corresponding to the electrode of each of the two-sided printed circuit boards. The resultant lamination was pressurized by a press having a temperature of 170° C. at a pressure of 60 kg/cm$^2$ for 60 minutes.

When the thickness of the base was reduced to be smaller than the size of the gold particles in the thickness direction of the base by compression, an inner via hole connection between a second conductive layer and a third conductive layer from the top was obtained via particles buried in the through-holes formed in the base interposed between the two two-sided printed circuit boards. In a similar manner as in Example 1, the resistance of an inner via hole connection was lowered in correspondence with an increase in the compression ratio. When the compression was 30% or more, a constant, low resistance was realized.

In a heat cycle test, the resistance did not greatly change even after 1000 cycles. Especially when the compression ratio of the gold particles was 30% or more, substantially no increase was indicated in the resistance of the inner via hole connection.

Next, a multi-layered printed circuit board including six conductive layers was produced in the following manner.

Three two-sided printed circuit boards produced in Example 1 were used. Such two-sided printed circuit boards each have an electrode pattern for measuring a resistance of the inner via hole connection. Two prepregs formed of alamid epoxy resin were interposed between the three two-sided printed circuit boards. The prepregs each include gold particles having a diameter of 0.20 mm at a position corresponding to the electrode of each of the two-sided printed circuit boards. The resultant lamination was pressurized under the identical conditions as described above. In such a multi-layered printed circuit board including six conductive layers, the same level of reliability as in the previous examples was confirmed.

EXAMPLE 5

A multi-layered printed circuit board including four conductive layers was produced in the following manner.

A two-sided printed circuit board produced in Example 1 was used. Such a two-sided printed circuit board has electrode patterns for measuring a resistance of an inner via hole connection. Two prepregs formed of alamid epoxy resin were provided on a top surface and a bottom surface of the two-sided printed circuit board. The prepregs include gold particles having a diameter of 0.20 mm at a position corresponding to the electrodes of the two-sided printed circuit board. The resultant lamination was covered with a copper foil on two outer surfaces thereof, and then pressurized by a press having a temperature of 170° C. at a pressure of 60 kg/cm$^2$ for 60 minutes.

The copper foils on the outer surfaces were etched by a known etching method, thereby forming an electrode pattern.

When the thickness of the bases was reduced to be smaller than the size of the gold particles in the thickness direction of the base by compression, an inner via hole connection between a first conductive layer and second conductive layer from the top and an inner via hole connection between a third conductive layer and a fourth conductive layer from the top were obtained via particles buried in the through-holes formed in the bases obtained from the prepregs. In a similar manner as in Example 1, the resistance of the inner via hole connections was lowered in correspondence with an increase in compression ratio. When the compression was 30% or more, a constant, low resistance was realized.

In a heat cycle test, the resistance did not greatly change even after 1000 cycles. Especially when the compression ratio of the gold particles was 30% or more, substantially no increases was indicated in the resistance of the inner via hole connection.

Example 6

A multi-layered printed circuit board including four conductive layers was produced the following manner.

Two two-sided printed circuit boards formed of glass epoxy resin having an electrode pattern for measuring a resistance of an inner via hole connection were used. A prepreg formed of alamid epoxy resin was interposed between the two two-sided printed circuit boards. The prepreg includes gold particles having a diameter of 0.20 mm at a position corresponding to the electrode of each of the two-sided printed circuit boards. The resultant lamination was pressurized by a press having a temperature of 170° C. at a pressure of 60 kg/cm$^2$ for 60 minutes.

When the thickness of the base was reduced to be smaller than the size of the gold particles in the thickness direction of the base by compression, an inner via hole connection between a second conductive layer and a third conductive layer from the top was obtained via particles buried in the through-holes formed in the base obtained from the prepreg. In a similar manner as in Example 1, the resistance of the inner via hole connection was lowered in correspondence with an increase in the compression ratio. When the compression was 30% or more, a constant, low resistance was realized.

In a heat cycle test, the resistance did not greatly change even after 200 cycles. Especially when the compression ratio of the gold particles was 30% or more, substantially no increase was indicated in the resistance of the inner via hole connection.

According to the present invention, a two-sided printed circuit board and a multi-layered printed circuit board, a plurality of conductive layers are electrically connected via conductive particles which are in contact with the conductive layers on a top surface and a bottom surface of the base as a result of compression. In such a structure, inner via hole connection can be realized between arbitrary conductive layers via the conductive particles. Accordingly, a complicated circuit can be obtained on a single board which has a base formed of a resin which is inexpensive.

According to a method for producing such a two-sided printed circuit board and a multi-layered printed circuit board, electric connection between a plurality of conductive layers can be realized via conductive particles buried in through-holes of the base, without plating on the inner surface of the through-holes. Further, the number of the conductive layers can be increased only by repeating the step of heating and pressurizing.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A two-sided printed circuit board, comprising:
   a base having a first surface, and a second surface substantially parallel to the first surface, the base having a plurality of through-holes;
   a first conductive layer provided on the first surface of the base;
   a second conductive layer provided on the second surface of the base; and
   a conductive particle provided in each of the through-holes in a pressurized state for electrically connecting the first conductive layer and the second conductive layer.

2. A two-sided printed circuit board according to claim 1, wherein the base is formed of a composite material containing an aromatic polyamide fiber and a thermosetting resin.

3. A two-sided printed circuit board according to claim 1, wherein the base is formed of an alamid epoxy resin sheet.

4. A two-sided printed circuit board according to claim 1, wherein the conductive particle is formed of a metal.

5. A two-sided printed circuit board according to claim 4, wherein the conductive particle is formed of a material selected from the group consisting of gold, silver, copper, nickel, palladium, lead and tin.

6. A two-sided printed circuit board according to claim 1, wherein each conductive particle includes a core and a conductive particle layer enclosing the core.

7. A two-sided printed circuit board according to claim 6, wherein the core is formed of a metal, and the conductive particle layer is formed of another metal adhering to the core.

8. A two-sided printed circuit board according to claim 6, wherein the core is formed of a resin, and the conductive particle layer is formed of a metal adhering to the core.

9. A multi-layered printed circuit board, comprising:
   two bases provided in a laminated state; and
   a conductive layer provided between the two bases, wherein
   the bases each include a plurality of through-holes,
   the through-holes each have a conductive particle provided therein in a pressurized state, and
   the conductive particle electrically connects the conductive layer and another conductive layer provided on at least one of the two bases.

10. A multi-layered printed circuit board according to claim 9, wherein the bases are formed of a composite material containing an aromatic polyamide fiber and a thermosetting resin.

11. A multi-layered printed circuit board according to claim 9, wherein the bases are formed of an alamid epoxy resin sheet.

12. A multi-layered printed circuit board according to claim 9, wherein the conductive particle is formed of a metal.

13. A multi-layered printed circuit board according to claim 12, wherein the conductive particles formed of a material selected from the group consisting of gold, silver, copper, nickel, palladium, lead and tin.

14. A two-sided printed circuit board according to claim 9, wherein each conductive particle includes a core and a conductive particle layer enclosing the core.

15. A two-sided printed circuit board according to claim 14, wherein the core is formed of a metal, and the conductive particle layer is formed of another metal adhering to the core.

16. A two-sided printed circuit board according to claim 14, wherein the core is formed of a resin, and the conductive particle layer is formed of a metal adhering to the core.

* * * * *